(12) United States Patent
Tsai et al.

(10) Patent No.: US 7,508,902 B2
(45) Date of Patent: Mar. 24, 2009

(54) SHIFT REGISTER

(75) Inventors: Cheng-Hung Tsai, Changhua County (TW); Chun-Yao Huang, Hsinchu (TW); Yi-Feng Liao, Taichung (TW)

(73) Assignee: Chunghwa Picture Tubes Ltd., Taoyuan (TW)

( * ) Notice: Subject to any disclaimer, the term of this patent is extended or adjusted under 35 U.S.C. 154(b) by 304 days.

(21) Appl. No.: 11/458,098

(22) Filed: Jul. 17, 2006

(65) Prior Publication Data

US 2008/0013669 A1    Jan. 17, 2008

(51) Int. Cl.
*G11C 21/00* (2006.01)
(52) U.S. Cl. .............................. 377/64; 377/73; 377/81; 327/202; 327/203
(58) Field of Classification Search ......... 327/202–203; 377/64, 70, 73–81
See application file for complete search history.

(56) References Cited

U.S. PATENT DOCUMENTS 4,746,915 A    5/1988 Sekiya 5,859,546 A * 1/1999 Yamauchi ................... 326/93
6,204,707 B1 * 3/2001 Hamada et al. ............. 327/202
6,630,853 B1 * 10/2003 Hamada ...................... 327/202
6,828,837 B2 * 12/2004 Ahn ........................... 327/202
6,909,314 B2 * 6/2005 Ahn ........................... 327/202

FOREIGN PATENT DOCUMENTS

JP          446597      *  2/1992
JP       2002169518        6/2002

* cited by examiner

*Primary Examiner*—Tuan T Lam
(74) *Attorney, Agent, or Firm*—Jianq Chyun IP Office

(57) ABSTRACT

A shift register including a plurality of stage circuits is provided. Each of the stage circuits has a shift circuit for receiving an input signal and providing an output signal. The output signal is obtained through the logic calculation and delaying of the input signal. Each of the stage circuits, except the first one, further includes a logic circuit used to produce at least one control signal according to the internal signals of the containing stage circuit, so as to replace at least one of the required clock signals during the operation of the corresponding shift circuit.

12 Claims, 5 Drawing Sheets

SHIFT REGISTER

BACKGROUND OF THE INVENTION

1. Field of Invention

The present invention relates to a shift register, and more particularly, to a shift register used for conducting logic calculations on internal signals to replace clock signals.

2. Description of Related Art

At present, the shift register has been widely used, such as in the source driver and gate driver of the thin film transistor liquid crystal display (TFT LCD) panel. The shift register is formed by connecting a plurality of stage circuits in series. FIG. 1 is a schematic circuit diagram of one of the stage circuits of the conventional shift register.

The stage circuit in FIG. 1 includes inverters I1-I4, three-state inverters T1-T4, and an NAND gate NG. The stage circuit of FIG. 1 receives an input signal IN from the previous stage circuit, and provides an output signal OUT when an output enable signal OE is enabled. The inverter I3 receives a clock signal CK and outputs an inverted clock signal CKB. The clock signals CK and CKB control the three-state inverters T1-T4. The three-state inverter T3 provides the input signal for the next stage circuit.

FIG. 2 is a signal timing diagram when five stage circuits as shown in FIG. 1 are connected in series during operation, wherein IN represents the input signal of the first stage circuit; CK represents the clock signal; OE represents the output enable signal; O1-O5 represent output signals of the first to fifth stage circuits respectively. As shown in FIG. 2, the output signals O1-O5 can be used as the thin film transistor (TFT) ON/OFF signals for five scan lines of the TFT LCD panel.

Each of the three-state inverters in FIG. 1 has the same structure. Taking T1 as an example, FIG. 3 is a schematic circuit diagram of the three-state inverter T1, which includes p-channel metal oxide semiconductor field effect transistors (PMOS transistors) P1 and P2 and n-channel metal oxide semiconductor field effect transistors (NMOS transistors) N1 and N2. The three-state inverter T1 has four end points, i.e., the input end SI, the output end SO, the first control end SC1, and the second control end SC2 respectively. As shown in FIG. 3, the PMOS transistor P1 is electrically connected to the input end SI and the voltage source VDD. The PMOS transistor P2 is electrically connected to the control end SC1, PMOS transistor P1, and the output end SO. The NMOS transistor N1 is electrically connected to the input end SI and the ground end GND. Finally, the NMOS transistor N2 is electrically connected to the control end SC2, NMOS transistor N1, and the output end SO. The output state can be derived from the circuit of the three-state inverter T1 as shown in Table 1.

TABLE 1

| | Output state of three-state inverter | | | |
|---|---|---|---|---|
| End point | SI | SC1 | SC2 | SO |
| Logic state | 0 | 0 | 0 | 1 |
| | 0 | 0 | 1 | 1 |
| | 1 | 1 | 1 | 0 |
| | 1 | 0 | 1 | 0 |

The conventional shift register as mentioned above has the following disadvantages. Due to the coupling of external clock signals, the three-state inverter has an unstable state, thereby resulting in additional electricity consumption. Moreover, the oscillation frequency of external clock signals is much higher than the operation frequency of the shift register. For example, if the above-mentioned shift register is applied to the gate driver of the TFT LCD panel with a resolution of 320×240, the cycle of the clock signals CK and CKB is about 50 us, whereas the operation cycle of the shift register is about 16.6 ms, with a difference of 333 times there-between. The undesirable high-frequency oscillation also results in additional electricity consumption. If the above problems can be eliminated, the electricity consumption of the whole circuit can be reduced.

SUMMARY OF THE INVENTION

The object of the present invention is to provide a shift register with lower electricity consumption.

To achieve the aforementioned or other objects, the present invention provides a shift register, which includes a plurality of stage circuits. Each of the stage circuits has a shift circuit for receiving an input signal and providing an output signal. The output signal is obtained through the logic calculation and delaying of the input signal. Each of the stage circuits, except the first one, further includes a logic circuit used to produce at least one control signal according to the internal signals of the containing stage circuit, so as to replace at least one of the clock signals required during the operation of the corresponding shift circuit.

As for the above-mentioned shift register, the shift circuit includes two inverters and four three-state inverters in one embodiment. Each of the three-state inverters has an input end, a first control end, a second control end and an output end. Each of the inverters has an input end and an output end. The first three-state inverter receives an input signal through its input end, a first clock signal through its first control end, and a second clock signal through its second control end. The first inverter is electrically connected to the output end of the first three-state inverter through its input end. The second three-state inverter is electrically connected to the output end of the first inverter through its input end; receives a first control signal through its first control end; receives a second control signal through its second control end; and is electrically connected to the input end of the first inverter through its output end. The third three-state inverter is electrically connected to the output end of the second three-state inverter through its input end; receives the second clock signal through its first control end; and receives the first clock signal through its second control end. The second inverter is electrically connected to the output end of the third three-state inverter through its input end, and the above-mentioned output signal is produced according to the output of the second inverter. The fourth three-state inverter is electrically connected to the output end of the second inverter through its input end; receives the first control signal through its first control end; receives the second control signal through its second control end; and is electrically connected to the input end of the second inverter through its output end.

As for the above-mentioned shift register, the logic circuit includes an XNOR gate and a third inverter in one embodiment. The XNOR gate has two input ends and an output end, is electrically connected to the output end of the second inverter of the containing stage circuit through its first input end, and is electrically connected to the output end of the first inverter through its second input end, so as to output the first control signal. The third inverter receives the first control signal and outputs the second control signal.

The above-mentioned shift register further comprises an NAND gate in one embodiment. The NAND gate has two input ends and an output end, receives an output enable signal through its first input end, and is electrically connected to the output end of the second inverter through its second input end. The above-mentioned output signal is produced according to the output of the NAND gate.

The above-mentioned shift register further comprises a fifth inverter in one embodiment. The fifth inverter has an input end and an output end, is electrically connected to the output end of the NAND gate through its input end, so as to output the above-mentioned output signal.

According to the preferred embodiments of the present invention, the internal signals of the stage circuit are used to produce the control signals, so as to replace a part of the clock signals required during the operation of the same stage circuit in the present invention. Therefore, both the unstable state caused by the coupling of the external clock signals and the undesirable high-frequency clock signal oscillation can be avoided, thereby reducing electricity consumption of the shift register.

In order to make the aforementioned and other objects, features and advantages of the present invention comprehensible, preferred embodiments accompanied with figures are described in detail below.

DESCRIPTION OF EMBODIMENTS

Figure 4:
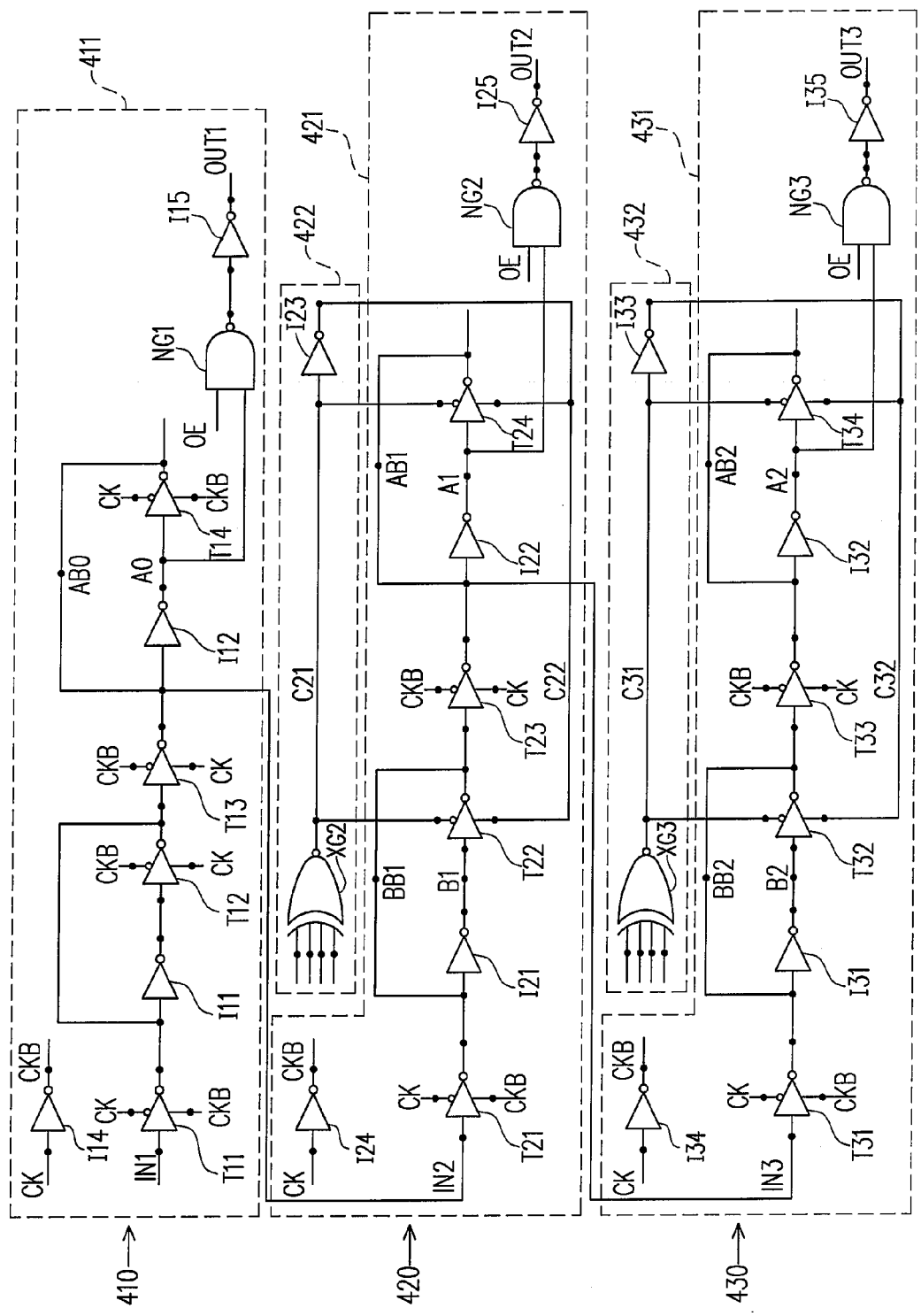
FIG. 4 is a schematic circuit diagram of a shift register according to an embodiment of the present invention.

FIG. 4 is a schematic circuit diagram of a shift register according to a preferred embodiment of the present invention. The shift register of FIG. 4 includes three stage circuits 410, 420, and 430, wherein the first stage circuit 410 only includes a shift circuit 411; each of the other two stage circuits includes a shift circuit and a logic circuit. In other words, the stage circuit 420 includes a shift circuit 421 and a logic circuit 422, and the stage circuit 430 includes a shift circuit 431 and a logic circuit 432.

The shift circuits 411, 421, and 431 receive input signals IN1-3 and provide output signals OUT1-3 respectively. Each of the output signals is obtained through the logic calculation and delaying of the input signal. The first input signal IN1 is provided by an external system and each of the other input signals is provided to the next stage circuit by the previous stage circuit. The logic circuit 422 is used to produce at least one control signal according to internal signals of the containing stage circuit 420, and then to replace at least one of the clock signals required during the operation of the corresponding shift circuit 421 with the control signal(s). Similarly, The logic circuit 432 is used to produce at least one control signal according to internal signals of the containing stage circuit 430, and then to replace at least one of the clock signals required during the operation of the corresponding shift circuit 431 with the control signal(s).

Although the shift register only includes three stage circuits in this embodiment, the shift register can include any number of stage circuits in other embodiments of the present invention.

Figure 1:
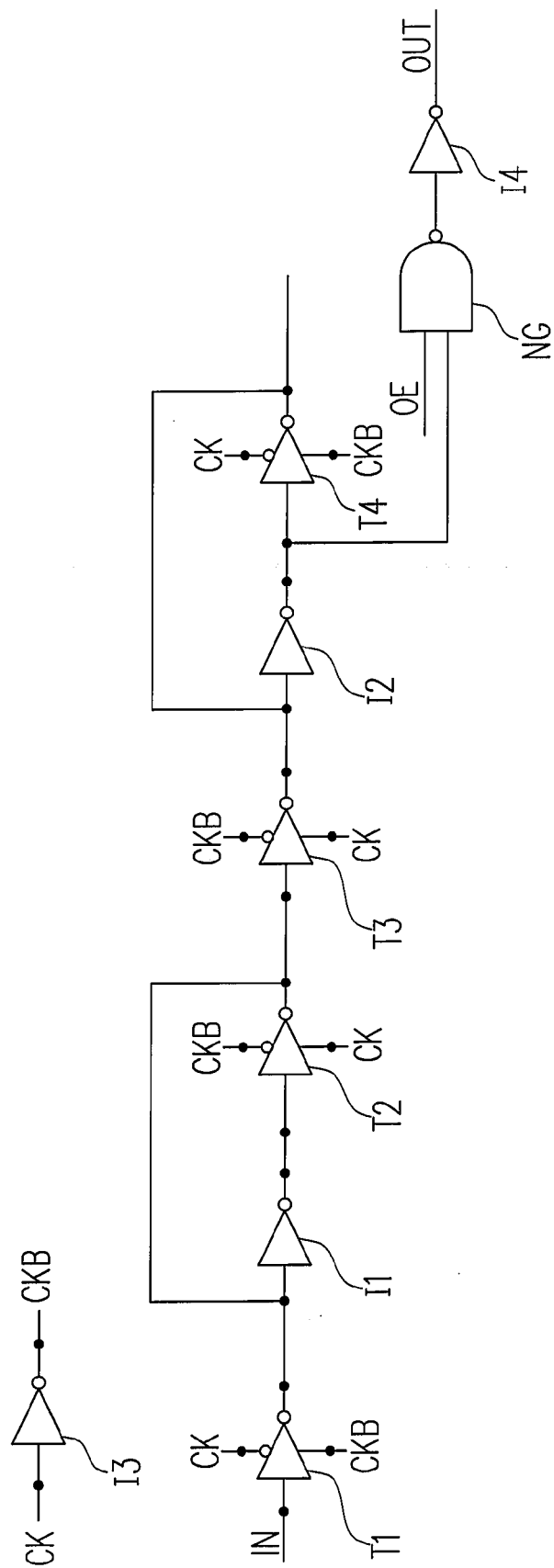
FIG. 1 is a schematic circuit diagram of an stage circuit of a conventional shift register.
Figure 2:
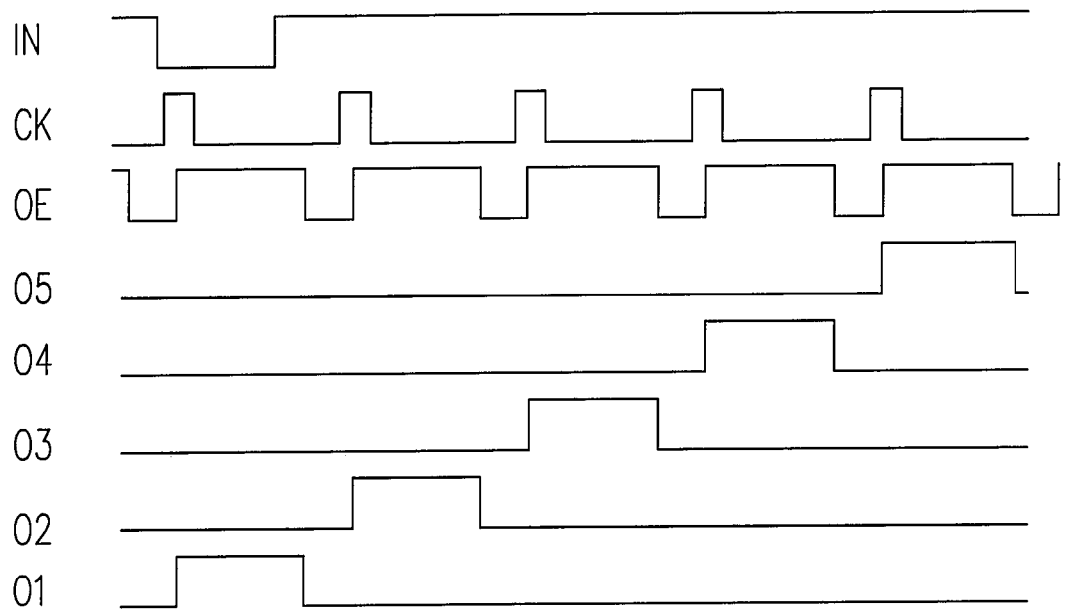
FIG. 2 is a signal timing diagram of the conventional shift register.
Figure 3:
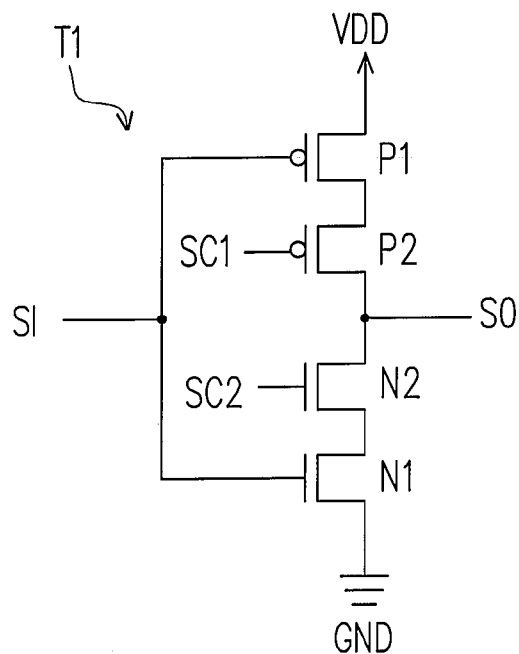
FIG. 3 is a schematic circuit diagram of a three-state inverter.

The shift circuit 411 is the same as that in FIG. 1, and thus no further details are provided herein. The shift circuits 421 and 431 have the same structure. Taking the shift circuit 421 as an example, the shift circuit 421 includes inverters I21, I22, I24, I25, three-state inverters T21-T24, and an NAND gate NG2. Each of the three-state inverters in this embodiment has an input end, a first control end, a second control end and an output end. Each of the inverters in this embodiment has an input end and an output end. The three-state inverter T21 receives the input signal IN2 through the input end, receives the clock signal CK through the first control end, and receives the clock signal CKB through the second control end. The input signal IN2 comes from the output end of the three-state inverter T13 of the previous stage circuit 410. The inverter I21 is electrically connected to the output end of the three-state inverter T21 through the input end. The three-state inverter T22 is electrically connected to the output end of the inverter I21 through the input end, and used for receiving the control signal C21 through the first control end, receiving the control signal C22 through the second control end, and is electrically connected to the input end of the inverter I21 through the output end.

The three-state inverter T23, electrically connected to the output end of the three-state inverter T22 through the input end, receives the clock signal CKB through the first control end, and receives the clock signal CK through the second control end. The inverter I22 is electrically connected to the output end of the three-state inverter T23 through the input end. The three-state inverter T24 is electrically connected to the output end of the inverter I22 through the input end; receives the control signal C21 through the first control end; receives the control signal C22 through the second control end; and is electrically connected to the input end of the inverter I22 through the output end. The NAND gate NG2 has two input ends and an output end, receives the output enable signal OE through one input end and is electrically connected to the output end of the inverter I22 through the other input end. The inverter I25 is electrically connected to the output end of the NAND gate NG2 through the input end, so as to provide an output signal OUT2.

The above-mentioned clock signal CKB is produced by the clock signal CK passing through the inverter I24, thus, the clock signal CKB is the inversed signal of the clock signal CK.

Each of the logic circuits in FIG. 4 has the same structure. Taking the logic circuit 422 as an example, the logic circuit 422 includes an XNOR gate XG2 and an inverter I23.

Figure 5:
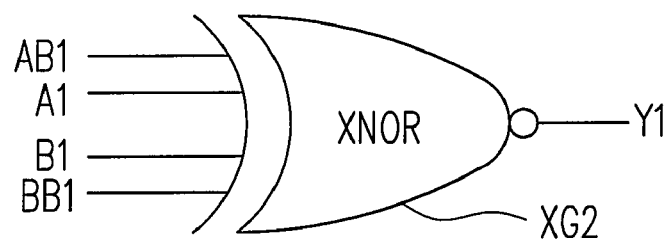
FIG. 5 is a schematic diagram of the XNOR gate of FIG. 4.

The XNOR gates in this embodiment have the same structure. Take the XNOR gate XG2 shown in FIG. 5 as example. The XNOR gate XG2 has four input ends A1, AB1, B1, and BB1, as well as an output end Y1. Signals received by the input ends A1 and AB1 are inverted to each other; on the other hand, signals received by the input ends B1 and BB1 are also inverted to each other. Therefore, the logic state of the output end Y1 can be determined from the logic states of the input ends A1 and B1. Table 2 is the truth table of the XNOR gate XG2. The truth table of the XNOR gate XG3 is very similar to that of XG2. The only difference is the input ends A1, AB1, B1, BB1 and the output end Y1 are replaced with A2, AB2, B2, BB2 and Y2, respectively.

TABLE 2

| True table of the XNOR gate XG2 | | | |
|---|---|---|---|
| End point | A1 | B1 | Y1 |
| Logic state | 0 | 0 | 1 |
| | 0 | 1 | 0 |
| | 1 | 0 | 0 |
| | 1 | 1 | 1 |

The XNOR gate XG2 of FIG. 4 is electrically connected to the output end of the inverter I22 through the input end A1; is electrically connected to the output end of the three-state inverter T23 through the input end AB1; is electrically connected to the output end of the inverter I21 through the input end B1; is electrically connected to the output end of the three-state inverter T21 through the input end BB1; and outputs the control signal C21. As shown in FIG. 4, the signals for the four input ends of the XNOR gate XG2 all come from the stage circuit 420 containing XG2. In another embodiment of the present invention, the XNOR gate with only two input ends A and B can be used, and the signals of the input ends AB and BB can be produced correspondingly according to the signals of the ends A and B.

The logic circuit 422 further includes an inverter I23 for receiving the control signal C21 and outputting the control signal C22. The stage circuit 420 uses the control signals C21 and C22 to replace the clock signals CK and CKB originally received by the three-state inverters T22 and T24.

Figure 6:
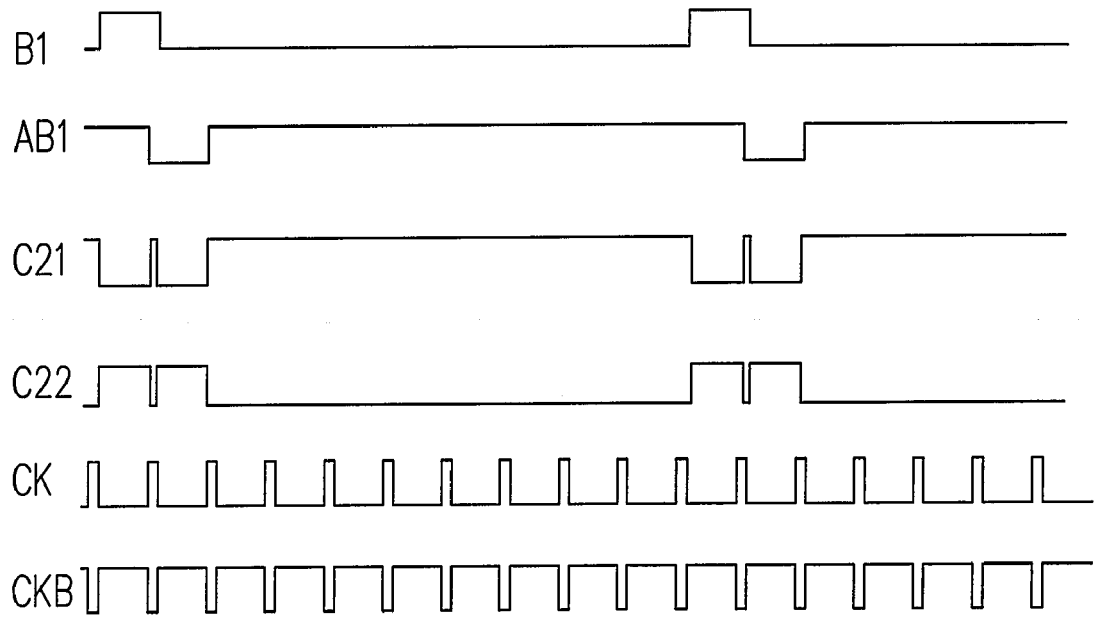
FIGS. 6 and 7 are signal timing diagrams of the shift register of FIG. 4.

FIG. 6 is a signal timing diagram produced by the shift register (in FIG. 4) through simulation, which includes signals received by the input ends AB1 and B1 of the XNOR gate XG2, control signals C21 and C22, and clock signals CK and CKB. As shown in FIG. 6, not every cycle of the clock signals CK and CKB, but the part actually required by the shift circuit 421 is replaced by the control signals C21 and C22. Therefore, the oscillation frequency of the signal is lowered, thereby reducing electricity consumption.

Figure 7:
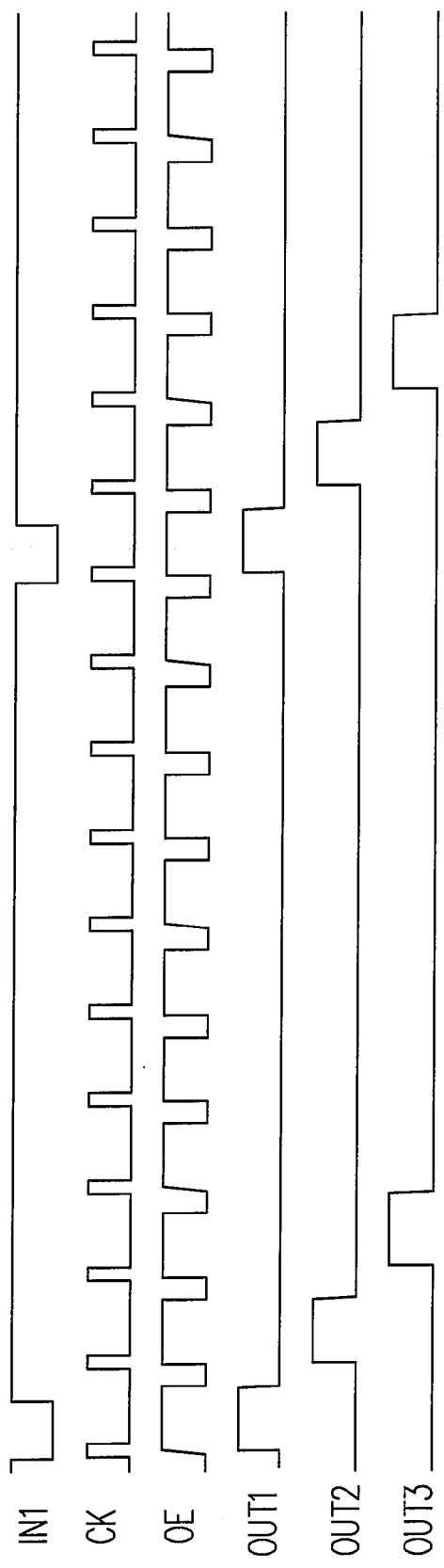

FIG. 7 is another signal timing diagram produced by the shift register (in FIG. 4) through simulation, which includes the input signal IN1 received by the first stage circuit 410, clock signals CK, output enable signal OE, and output signals OUT1-3 provided by the stage circuits 410, 420 and 430 respectively. As shown in FIG. 7, the shift register in FIG. 4 does provide the output signals OUT1-3, the same as that provided by the conventional shift register.

In this embodiment, the logic circuit is used to produce control signals according to the internal signals of the stage circuit, so as to replace a part of the clock signals required during the operation of the same stage circuit. Not only the unstable state caused by the coupling of the external clock signals but also the undesirable high-frequency clock signal oscillation can be avoided, thereby reducing electricity consumption. The following Table 3 shows the electricity consumption simulation result for both the conventional shift register and this embodiment. As shown in Table 3, the circuit operation frequency, current consumption, and electricity consumption of the shift register are significantly reduced in this embodiment. The improvement provided by the present invention can be used in any application field of the shift register, such as the source driver and gate driver of the TFT LCD panel.

TABLE 3

| Comparison of electricity consumption for shifter register | | |
|---|---|---|
| | Conventional art | Present embodiment |
| Circuit Operation Frequency | 20 kHz | 60 Hz |
| Current Consumption | 171 uA | 56 uA |
| Electricity Consumption | 100% | 50% |

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A shift register, comprising a plurality of stage circuits, wherein each of the stage circuits includes:
   a shift circuit, for receiving an input signal and providing an output signal obtained through logic calculation and delaying of the input signal, the shift circuit includes:
      a first three-state inverter, having an input end, a first control end, a second control end and an output end, for receiving the input signal through its input end, receiving a first clock signal through its first control end, and receiving a second clock signal through its second control end;
      a first inverter, having an input end and an output end, electrically connected to the output end of the first three-state inverter through its input end;
      a second three-state inverter, having an input end, a first control end, a second control end and an output end, electrically connected to the output end of the first inverter through its input end, for receiving a first control signal through its first control end, for receiving a second control signal through its second control end, and electrically connected to the input end of the first inverter through its output end;
      a third three-state inverter, having an input end, a first control end, a second control end and an output end, electrically connected to the output end of the second three-state inverter through its input end, for receiving the second clock signal through its first control end, for receiving the first clock signal through its second control end;
      a second inverter, having an input end and an output end, electrically connected to the output end of the third three-state inverter through its input end, wherein the output signal is produced according to the output of the second inverter; and
      a fourth three-state inverter, having an input end, a first control end, a second control end and an output end, electrically connected to the output end of the second inverter through its input end, for receiving the first control signal through its first control end, for receiving the second control signal through its second control end, and electrically connected to the input end of the second inverter through its output end;
   and
   each of the stage circuits, except the first one, further including:
   a logic circuit, for producing a control signal according to an internal signal of the containing stage circuit and replacing a clock signal required during the operation of the corresponding shift circuit with the control signal, the logic circuit includes:

an XNOR gate, having a first input end, a second input end and an output end, electrically connected to the output end of the second inverter of the stage circuit through its first input end, and electrically connected to the output end of the first inverter through its second input end, outputting the first control signal; and a third inverter, for receiving the first control signal and outputting the second control signal.

2. The shift register as claimed in claim 1, wherein the input signal is produced by the previous stage circuit.

3. The shift register as claimed in claim 2, wherein the input signal is produced by the output end of the third three-state inverter of the previous stage circuit.

4. The shift register as claimed in claim 1, wherein the second clock signal is an inverted signal of the first clock signal.

5. The shift register as claimed in claim 4, wherein the second clock signal is produced by the first clock signal passing through a fourth inverter.

6. The shift register as claimed in claim 1, wherein each of the three-state inverters is cut off when its first control end is at a first state and its second control end is at a second state, and outputs the inverted state of its input end when its first control end is at the second state and its second control end is at the first state.

7. The shift register as claimed in claim 6, wherein the first state is logic 1, and the second state is logic 0.

8. The shift register as claimed in claim 7, wherein each of the three-state inverters comprises:

a first p-channel metal oxide semiconductor field effect transistor (PMOS transistor), electrically connected to the input end and a voltage source;

a second PMOS transistor, electrically connected to the first control end, the first PMOS transistor, and the output end of the three-state inverter;

a first n-channel metal oxide semiconductor field effect transistor (NMOS transistor), electrically connected to the input end and a ground end; and a second NMOS transistor, electrically connected to the second control end, the first NMOS transistor, and the output end.

9. The shift register as claimed in claim 6, wherein the first state is logic 0, and the second state is logic 1.

10. The shift register as claimed in claim 1, wherein the XNOR gate further comprises a third input end electrically connected to the output end of the third three-state inverter of the stage circuit, and a fourth input end electrically connected to the output end of the first three-state inverter.

11. The shift register as claimed in claim 1, further comprising:

an NAND gate, having a first input end, a second input end and an output end, for receiving an output enable signal through its first input end, and electrically connected to the output end of the second inverter through its second input end, wherein the output signal is produced according to the output of the NAND gate.

12. The shift register as claimed in claim 11, further comprising:

a fifth inverter, having an input end and an output end, electrically connected to the output end of the NAND gate through its input end, outputting the output signal.

* * * * *